United States Patent
Leibfritz et al.

(10) Patent No.: US 10,469,333 B2
(45) Date of Patent: Nov. 5, 2019

(54) NETWORK ANALYZER SYSTEMS AND METHODS FOR OPERATING A NETWORK ANALYZER

(71) Applicant: Rohde & Schwarz GmbH & Co. KG, München (DE)

(72) Inventors: Martin Leibfritz, Munich (DE); Mike Leffel, Crystal Lake, IL (US)

(73) Assignee: ROHDE & SCHWARZE GMBH & CO. KG, Munich (DE)

( * ) Notice: Subject to any disclaimer, the term of this patent is extended or adjusted under 35 U.S.C. 154(b) by 387 days.

(21) Appl. No.: 15/232,973

(22) Filed: Aug. 10, 2016

(65) Prior Publication Data

US 2018/0048535 A1  Feb. 15, 2018

(51) Int. Cl.
  *H04L 12/24* (2006.01)
  *H04L 12/26* (2006.01)
  *G01R 27/28* (2006.01)
  *G01R 35/00* (2006.01)

(52) U.S. Cl.
  CPC .............. *H04L 41/24* (2013.01); *G01R 27/28* (2013.01); *G01R 35/005* (2013.01); *H04L 43/50* (2013.01)

(58) Field of Classification Search
  CPC ...................................................... H04L 41/24
  See application file for complete search history.

(56) References Cited

U.S. PATENT DOCUMENTS

| | | | |
|---|---|---|---|
| 5,793,213 A * | 8/1998 | Bockelman | G01R 35/005 324/601 |
| 6,823,276 B2 | 11/2004 | Blackham et al. | |
| 7,019,536 B1 * | 3/2006 | Anderson | G01R 27/28 324/601 |
| 9,581,630 B2 * | 2/2017 | Verbeyst | G01R 27/28 |
| 9,667,302 B2 * | 5/2017 | Winiecki | H04B 17/14 |
| 2008/0018342 A1 * | 1/2008 | Hiebel | G01R 27/28 324/601 |
| 2010/0122106 A1 * | 5/2010 | Lee | G06F 1/12 713/503 |
| 2011/0054951 A1 * | 3/2011 | Bennett, Jr. | G06F 17/21 705/4 |
| 2016/0364619 A1 * | 12/2016 | Ogata | G06K 9/00362 |

\* cited by examiner

*Primary Examiner* — Moustafa M Meky
*Assistant Examiner* — Sm Z Islam
(74) *Attorney, Agent, or Firm* — Shumaker & Sieffert, P.A.

(57) ABSTRACT

A network analyzer system includes a network analyzer having at least two ports, a first operational device connected a first port of the at least two ports of the network analyzer and configured to perform a first task with the network analyzer, and a second operational device connected a second port of the at least two ports of the network analyzer and configured to perform a second task with the network analyzer. The second task is performed at least partially concurrently with the first task.

38 Claims, 2 Drawing Sheets

NETWORK ANALYZER SYSTEMS AND METHODS FOR OPERATING A NETWORK ANALYZER

FIELD OF THE INVENTION

The present invention relates to network analyzers, network analyzer systems and methods for operating a network analyzer. Such methods and systems may be employed for purposes of calibrating network analyzers, particularly vector network analyzers for use in testing environments.

BACKGROUND OF THE INVENTION

Electronic equipment, such as a mobile communication device or a mobile computing device, is subject to various electronic tests after production. Such tests are generally necessary to ensure proper configuration, calibration and functionality of various elements of the devices under test (DUT). For testing purposes, specific testing devices are employed which simulate a testing environment under predefined testing conditions. For example, testing devices may employ one or more specific testing routines with predefined testing schedules. Those testing schedules regularly involve input of particular test signal sequences into the DUT and/or reception of responses to testing signals input to the DUT. Such responses may be evaluated for consistency, constancy, timeliness and other properties of an expected behaviour of the DUT.

Of particular relevance are tests and testing devices for electronic equipment which is operated in an environment sensitive to radio frequency (RF) signals. Such equipment may be used to output, receive, measure or otherwise process RF-sensitive parameters and signals. Those tests are conventionally performed using standardized testing routines conducted by specifically designed testing equipment that is connected to a DUT.

Network analyzers are commonly used instruments designed to measure network parameters of electrical networks. Due to the ease of measurement of reflection and transmission at high frequencies network analyzers commonly measure s-parameters, but other network parameter sets such as y-parameters, z-parameters, and h-parameters may be measured as well. Network analyzers are often used to characterize two-port networks such as amplifiers and filters, but they can be used on networks with an arbitrary number of ports.

Network analyzers require periodic calibration. Typically such calibration is performed once per year, for example by a manufacturer or by a third party in a calibration laboratory. The accuracy and reliability of a network analyzer may be enhanced if systematic errors in the instrument are corrected and the characteristics of cables, adapters and test fixtures are accounted for. Additionally, user calibration may be performed in order to correct for any errors during operation of the network analyzer.

Network analyzers have connectors on its front panel to which test cables may be connected. The length of those cables will inter alia introduce time delays, corresponding phase shifts, and attenuation, all of which may affect the outcome of measurements done by the network analyzer. Calibration usually involves measuring known standards and using those measurements to compensate for systematic errors. Calibration may be a time-consuming and cumbersome task for both the engineer using the network analyzer as well as the manufacturer during periodic calibration.

Document U.S. Pat. No. 6,823,276 B2 discloses systems and methods for flexible and accurate test apparatus error value calculation. Document U.S. Pat. No. 7,019,536 B1 discloses methods for calibrating a multi-port vector network analyzer.

SUMMARY OF THE INVENTION

According to the disclosure of present invention network analyzers, network analyzer systems and methods for operating a network analyzer may be implemented.

Specifically, according to a first aspect of the invention, a network analyzer system includes a network analyzer having at least two ports; a first operational device connected a first port of the at least two ports of the network analyzer and configured to perform a first task with the network analyzer; and a second operational device connected a second port of the at least two ports of the network analyzer and configured to perform a second task with the network analyzer, the second task being performed at least partially concurrently with the first task.

According to a second aspect of the invention, a network analyzer system includes a network analyzer having at least two ports; and an operational device having a first operational unit connected a first port of the at least two ports of the network analyzer and configured to perform a first task with the network analyzer and a second operational unit connected a second port of the at least two ports of the network analyzer and configured to perform a second task with the network analyzer, the second task being performed at least partially concurrently with the first task.

According to a third aspect of the invention, a method for operating a network analyzer comprises performing a first task with a network analyzer under the control of a first operational device connected to a first port of a network analyzer; and performing a second task with the network analyzer under the control of a second operational device connected to a second port of the network analyzer, the second task being performed at least partially concurrently to the first task.

According to a fourth aspect of the invention, a method for operating a network analyzer comprises performing a first task with a network analyzer under the control of a first unit of an operational device connected to a first port of a network analyzer; and performing a second task with the network analyzer under the control of a second unit of the operational device connected to a second port of the network analyzer, the second task being performed at least partially concurrently to the first task.

One of the ideas of the present invention is to make good use of unused ports of the network analyzer during performance of a first task. The unused ports of the network analyzer may be used for performing a second task. Due to the usage of the unused ports the percentage of ports of the network analyzer used at any given point in time increases in average. Specifically, the second task may at least partially be performed concurrently with the performance of the first task.

Having tasks running in parallel to each other enhances the uptime of any given port of the network analyzer in average. For example, if a second task is performed in parallel to a first task, the efficiency of the network analyzer is approximately doubled with respect to a network analyzer that only performs the first task. In other words, the efficiency of the network analyzer would be halved, if only a first task would be performed instead of a first task and a second task in parallel.

Amongst others, there are several specific advantages associated with such network analyzer systems and their concomitant operating methods. The efforts spent by users operating the network analyzer system may be less than for conventional network analyzers. For example, the time needed by a user of the network analyzer system to perform a first task and a second task may be less, if the first task and the second task are performed concurrently instead of one after the other.

The modularity of the network analyzer systems further allows for very flexible adaptation on the number and/or nature of the tasks to be performed in parallel. Specifically for the growing technical and functional diversification of network analyzer systems, such flexibility may be put to great use when trying to efficiently and quickly meet calibration demands on time.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the accompanying drawings. Elements in the drawings are illustrated for simplicity and clarity and have not necessarily been drawn to scale.

In all figures of the drawings elements, features and components which are the same or at least have the same functionality have been provided with the same reference symbols, unless explicitly stated otherwise.

DETAILED DESCRIPTION OF THE EMBODIMENTS

Figure 1:
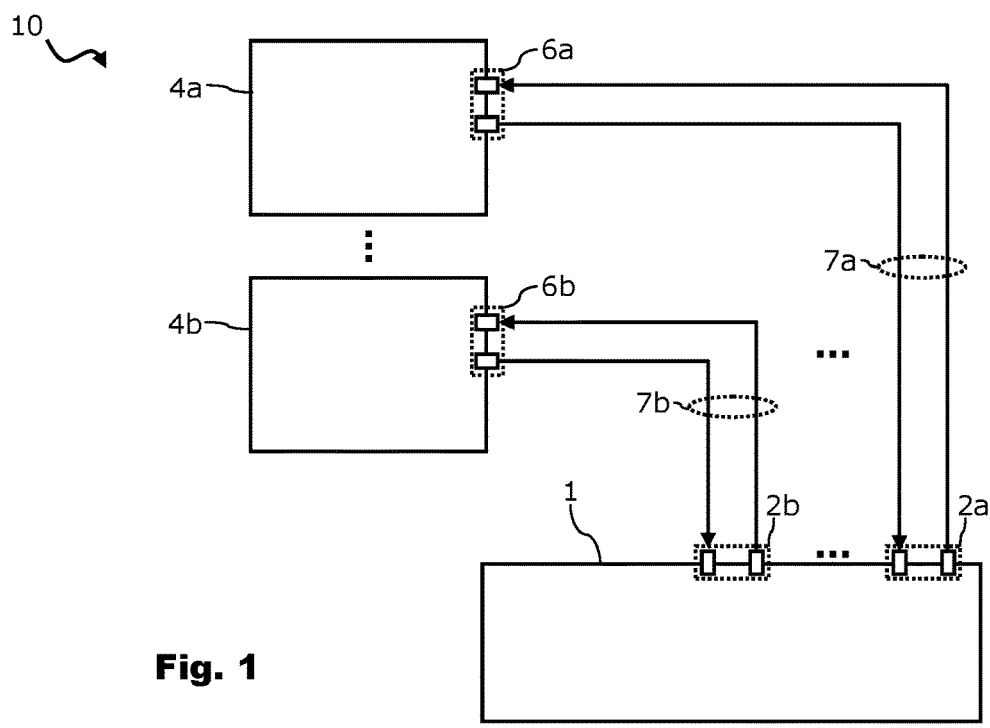
FIG. 1 schematically illustrates a network analyzer system according to some embodiments of the invention.
Figure 2:
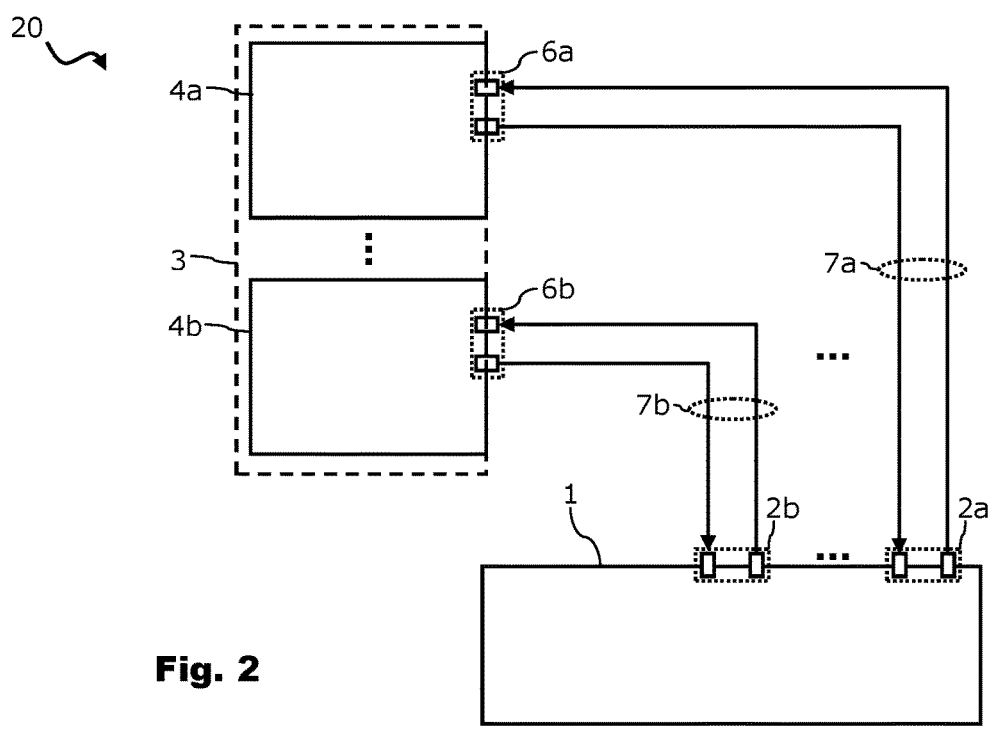
FIG. 2 schematically illustrates a network analyzer system according to some other embodiments of the invention.
Figure 3:
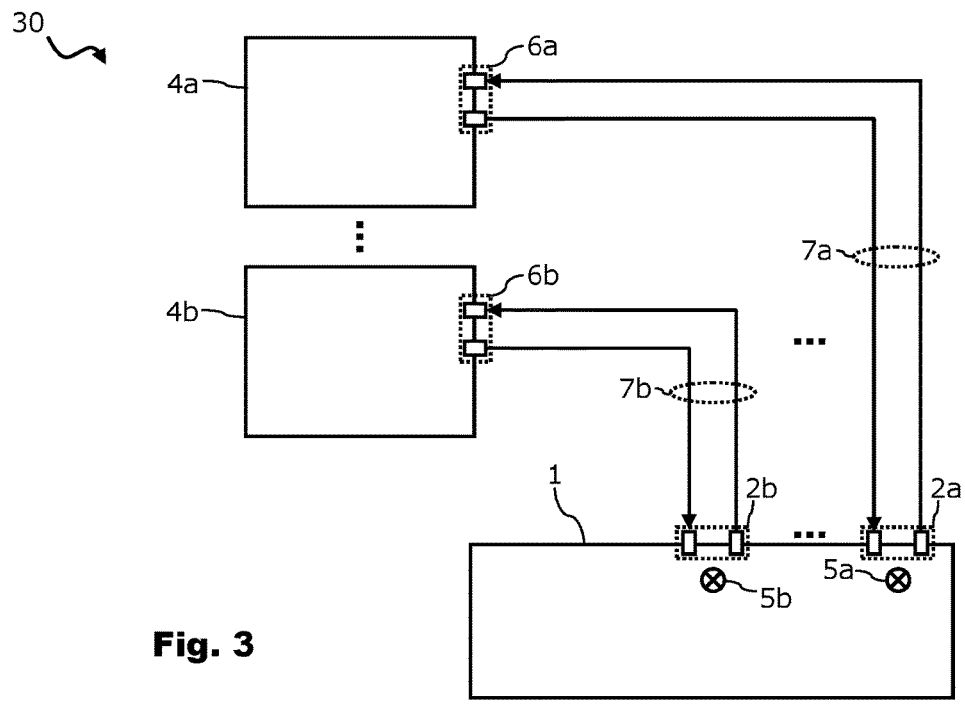
FIG. 3 schematically illustrates a network analyzer system according to some other embodiments of the invention.

FIGS. 1, 2 and 3 schematically illustrate network analyzer systems 10, 20 and 30. The network analyzer systems 10, 20 and 30 each comprise a network analyzer 1, in particular a vector network analyzer. The network analyzer 1 may for example be configured to analyze networks. Specifically, the network analyzer 1 may be employed to perform functional tests and testing routines on one or more devices under test (DUT). Specifically, the network analyzer 1 may be used to perform tests for mobile communication or computing devices such as laptops, notebooks, tablets, smartphones, mobile phones, pagers, PDAs, digital still cameras, digital video cameras, portable media players, gaming consoles, virtual reality glasses, mobile PCs and similar electronic equipment. Of course, it should be recognized that other non-mobile electronic equipment may be tested as well, such as—but not limited to—industrial field devices, radio communication base stations, video and TV devices, audio devices like loudspeakers and similar.

The network analyzer 1 may comprise a number of interfaces 2a, 2b having a number of ports each. The number of interfaces 2a, 2b is in general not limited to any particular number, but will be determined by the properties and facilities of the network analyzer 1 employed, as will be detailed hereinbelow. Similarly, the number of ports per interface 2a, 2b is in general not limited to any particular number, but will be determined by the properties and facilities of the network analyzer 1 employed. The network analyzer systems 10 and 30 may particularly be configured and adapted to be involved in a method M1 for operating a network analyzer as shown and explained in conjunction with FIG. 4 below. The network analyzer system 20 may particularly be configured and adapted to be involved in a method M2 for operating a network analyzer as shown and explained in conjunction with FIG. 5 below.

Referring to FIGS. 1, 2 and 3, the network analyzer systems 10, 20 and 30 may each comprise a number of operational devices 4a, 4b which may be connected to corresponding interfaces 2, 2b of the network analyzer 1. The connection between the operational devices 4a, 4b and the ports 2a, 2b of the network analyzer 1 may be established by a number of cables 7a, 7b in each case. For example, the first operational device 4a may be connected by a number of first cables 7a to a number of ports 2a of a first interface 7a. The second operational device 4b may be connected by a number of second cables 7b to a number of ports 2b of a second interface 7b.

The cables 7a, 7b may be any electrical connection type, such as for example, but not limited to, coax cables with BNC connectors. The length of the cables 7a, 7b used to form the wired connections between the operational devices 4a, 4b and the network analyzer may in particular be larger than about 1.5 meters (60 inches), particularly larger than about 2 meters (80 inches), and more particularly larger than about 2.5 meters (100 inches). The data rate of data transmitted between the operational devices 4a, 4b and the network analyzer 1 via the wired connections in form of the cables 7a, 7b may in particular be larger than 1 Mbps, particularly larger than 2 Mbps, more particularly larger than 10 Mbps. The wired connections may be full duplex or at least half-duplex.

The number of ports of the network analyzer 1 is in principle not limited. However, the number of ports may be four or more, more particularly eight or more.

Referring to FIG. 1, the operational devices 4a, 4b may be physically separate components. In contrast thereto, the operational devices 4a, 4b may be functional units integrated into a single physical operational device 3.

The two or more operational devices 4a, 4b may or may not be in communication with each other. Particularly, when the operational devices 4a, 4b are not in communication with each other they may perform tasks with the network analyzer 1 separately and asynchronously. In that case, the network analyzer 1 may be equipped with means to internally balance access of the operational devices 4a, 4b to the commonly employed functional components of the network analyzer 1. That way, the operational devices 4a, 4b may perform pipelined task using the same components of the network analyzer 1, i.e. in virtual synchronization.

The first operational device 4a may for example be a calibration device configured to perform calibration tasks of the network analyzer 1. The second operational device 4b may for example be a calibration device configured to perform calibration tasks of the network analyzer 1. It may be possible in some embodiments for the first operational device 4a and the second operational device 4b to be both calibration devices configured to perform similar or complementary calibration tasks of the network analyzer 1.

The first operational device 4a may in some embodiments be configured to operate in a frequency band different from the frequency band the second operational device 4b is configured to operate in. It may further be possible for the first operational device 4a to be configured to operate on a power level different from the power level the second operational device 4b is configured to operate on. It may further be possible for the first operational device 4a to be configured to operate with an operation technique different from the operation technique the second operational device 4b is configured to operate with.

In some embodiments, the first operational device 4a may comprise a first detector and the second operational device 4b may comprise a second detector, the second detector being of a detector type that is different from the detector type of the first detector. In some embodiments, the first operational device 4a may comprise a first detector and the second operational device 4b may comprise a second detector, the second detector being of a detector type that is different from the detector type of the first detector.

The operational devices 4a, 4b are both configured to perform task with the network analyzer 1. For example, the first operational device 4a may be configured to perform at least one first task with the network analyzer 1. The second operational device 4b may be configured to perform at least one second task with the network analyzer. The at least one first task and the at least one second task may be performed at partially concurrently, i.e. at last a part of the duration of the first task overlaps with a part of the duration of the second task. It may in some cases be possible for a number of second tasks to be performed during performance of the first task, particularly if the duration of each of the second tasks is shorter than the duration of the first task. In some embodiments it may be possible for the first task and the second task to be performed synchronously, i.e. the overlap in the duration of the first task and the second task may be such that start and end of both the first task and the second task substantially coincide.

In some embodiments, the second task may involve a complementary operation to the operation of the first task. For example, the second task may be a verification operation for the result of the first task. In some embodiments, the second task may utilize a noise source to perform a noise figure or noise path calibration of the network analyzer 1. In some embodiments, the second task may be configured to measure a set of independent standards.

The second task may involve performing a second calibration over a different frequency band. The second task may involve performing a second calibration over a different power level. The second task may involve performing a second calibration using a different technique, such as UOSM or TOSM, or TRM, etc. The second task may involve performing a second calibration using a different IF BW. The second task may involve performing a second calibration using a different detector, or a different AGC setting, etc.

The second task could be intended to provide unique information to the VNA error correction algorithm allowing the VNA to obtain an enhanced error model. This may be referred to as second stage correction, for example. The second task may include the measurement of a more accurate calibration standard that what is obtained in the first task. For example, the second task could measure a fixed airline through path, replacing the through path measurement that is normally obtained by the first task.

In some embodiments, the second task may provide a more accurate match standard. In some embodiments, the second task may provide a power measurement to augment an S-parameter calibration. In some embodiments, the second task may utilize a noise source to perform a noise figure or noise path calibration to augment the S-parameter calibration, enabling calibrated noise figure measurements. In some embodiments, the second task may utilize a phase reference to augment the S-parameter calibration, providing enabling non-linear measurements for the network analyzer. In some embodiments, the second task may provide a verification measurement which is meant to check the validity of the calibration performed in the first task. The second task may in some instances use a Tee-Checker. The second task may in some instances measure a mismatch airline. In some embodiments, the second task may measure a set of independent standards, which are switched into the path, including, for example, a mismatch load, a phase shifted reflection, or any other independent impedance.

The second task may be performed using a second calibration device, which is optimized over a unique set of parameters when compared to the first operational device being configured as primary calibration device. For example, the primary calibration device may be optimized over a frequency range of 8 GHz to 70 GHz, and the second calibration device may be optimized over the frequency range of 100 kHz to 18 GHz. Thus, each banded calibration device may offer higher performance values than a design with a single wideband calibration device could offer. The transition point between the two calibration devices may be at any single frequency in the overlap region, for example, between 8 and 18 GHz. Alternatively, the transition point may be a smooth transition utilizing the overlapping region of 8 GHz to 18 GHz to avoid steps or discontinuities in the error correction model. Various mathematical algorithms exist in the prior art which can provide a smooth transition.

In some embodiments, the second calibration device may use a different design than the first calibration device, allowing for further optimization. For example, the first calibration device may use high frequency switching elements, and the secondary calibration device may use low frequency switching elements. In some embodiments, the first calibration device may be optimized for minimal electrical length from the connector to the impedance standards, while the second calibration device is optimized for lowest possible cost.

In some embodiments, the connections between the network analyzer 1 and the first and second operational devices 4a, 4b may be automatically detected. In some embodiments an integrated power sensor may be provided which serves the dual purpose of providing a 50 match standard in addition to providing a power calibration in the channel. The power sensor may take the position of the match standard such that the automatic calibration does not need any additional switching paths.

Referring to FIG. 3, LEDs 5a, 5b may be incorporated into the network analyzer 1 (or alternatively in the operational devices 4a, 4b) in order to guide the user in cable movement. In some embodiments, diagrams and text may be included in the user interface of the network analyzer 1 in order to guide the user in the first task and the second task. In some embodiments mixed gender connectors may be used for the operational devices 4a, 4b. Alternatively, mixed connector types may be used for the operational devices 4a, 4b.

At the conclusion of the first task and the second task, a post calculation may in some cases be invoked to take advantage of the information additionally obtained during the second task. For example, the calibration results from two calibration operations performed in the first task and the second task may be merged for a more accurate result, for example, in a weighted fashion where the first and second calibrations are more optimal at different frequencies or power levels. This weighting may in some cases be dynamically determined based on the raw measurement results. For example, a tee-check calculation may be used to determine where each calibration is more accurate, and this information can be used to adjust or determine the weighting. Alternatively, raw measurements may be examined to find areas with optimal phase separation, or better VSWR, etc.; this information may be used to adjust or determine the weighting criteria.

In some embodiments, a calibration operation in the first task may be independently verified using the data acquired in the second task, for example, with a tee-checker or with mismatch standards. In some embodiments, a calibration operation in the first task may be independently verified using data acquired in the second task, for example, utilizing traceable verification standards. In this way the second task may be used to determine if the calibration obtained in the first task meets a minimum standard or specification. This verification concept may in some embodiments be extended further by providing a calculated effective system performance as a post calculation utilizing the verification data from the second task. This calculated effective system performance can be utilized to display real time measurement uncertainties which are based on the calibration performed in the first task. In some embodiments a power calibration may be merged with an S-parameter calibration providing a more complete error model.

The operational devices 4a, 4b may be physically combined into a single four port device, or can be maintained as two independent devices. Each approach offers advantages and disadvantages in terms of cost, shared or independent thermal environment, shared or independent control, for example, via USB. In some cases, flexibility in physically orienting the device ports in a particular manner, for example, in a planar fashion or at a particular angle may be obtained. The operational devices 4a, 4b or the operational device 3 may include LEDS or a display to provide feedback to the operator indicating which cables 7a, 7b need to be swapped, for example during a calibration operation. The network analyzer 1 or another controller may automatically detect if the cables 7a, 7b have been properly swapped.

The network analyzer 1 or another controller may automatically adapt if the user changes the order of swapping cables, with the goal of providing the same results as if the operator followed the guided list.

The interfaces 2a, 2b may be coaxial, waveguide, probe points, blind mates, or any other means for coupling the RF fields to and from the network analyzer 1. The connectors may have either gender (male/female) or may be sexless.

The operational device 3 may for example be a four-port automatic calibration device covering a frequency range of 10 MHz to 67 GHz, as an example. The first operational unit 4a may in this case be a two-port calibration unit that may be optimized, for example, over the frequency range of 10 MHz to 18 GHz. The second operational unit 4b may in this case be a two-port calibration unit that may be optimized over 8 GHz to 70 GHz. The banded automatic calibration device may provide superior performance over any single two-port calibration unit that needs to cover the entire frequency range between 10 MHz and 70 GHz. The lower starting frequency and higher ending frequency may can be adjusted to match the particular situation. The transition frequency may be selected or placed anywhere between the starting and ending frequency. The transition may be a region or a single point, and techniques may be used for transitioning smoothly from one region to the other.

Figures 4, 5:
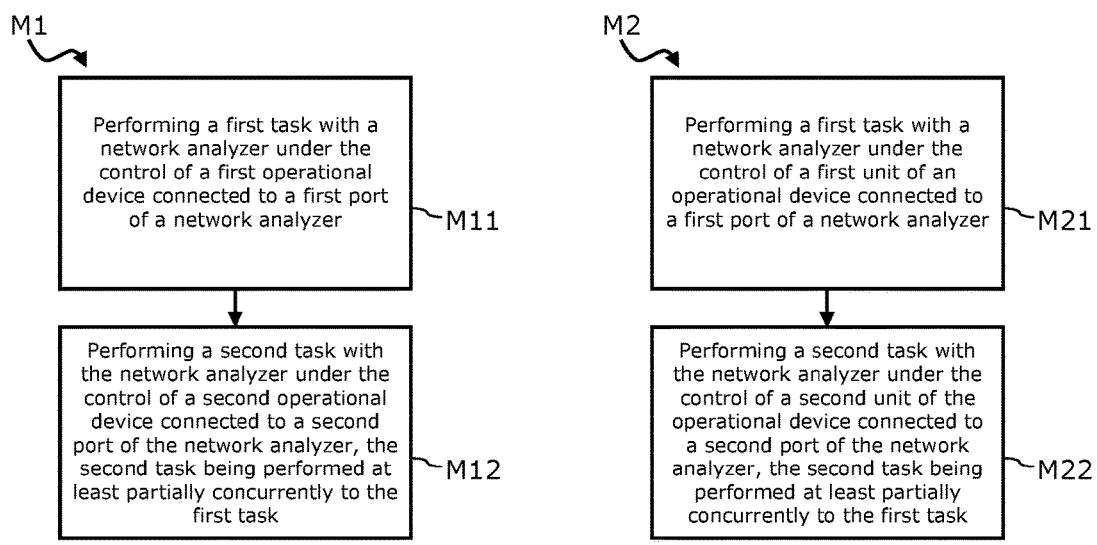
FIG. 4 shows a flowchart of procedural stages of a method for operating a network analyzer according to some further embodiments of the invention.
FIG. 5 shows a flowchart of procedural stages of a method for operating a network analyzer according to some further embodiments of the invention.

FIG. 4 schematically illustrates procedural stages of a method M1 for operating a network analyzer 1. The method M1 may be performed using the network analyzer systems 10 or 30 of one of the FIGS. 1 and 3.

In the method M1, a first task is performed with a network analyzer under the control of a first operational device connected to a first port of a network analyzer at M11.

At M12, a second task is performed with the network analyzer under the control of a second operational device connected to a second port of the network analyzer, the second task being performed at least partially concurrently to the first task.

FIG. 5 schematically illustrates procedural stages of a method M2 for operating a network analyzer 1. The method M2 may be performed using the network analyzer system 20 of FIG. 2.

In the method M2, a first task is performed with a network analyzer under the control of a first unit of an operational device connected to a first port of a network analyzer at M21.

At M22, a second task is performed with the network analyzer under the control of a second unit of the operational device connected to a second port of the network analyzer, the second task being performed at least partially concurrently to the first task.

Processing circuits in the specification may, for example, be or comprise a microprocessor or microcontroller. Such processing circuits may be employed in a processing device, for example a central processing unit (CPU) and/or a coprocessor and/or a digital signal processor and/or an embedded processor. The processing circuit may for instance include one, or more, processor cores which can execute the instructions in a memory connected to the processor core. The processor cores may for instance include the logic circuitry required to execute program code in the form of machine code. The processor cores may for instance at least include an instruction decoder, an arithmetic unit, an address generation unit, and a load/store unit. The processing circuit may for example include, in addition to the processor core, inputs/outputs or other components, such as and/or communication interfaces and/or coprocessors and/or analog-to-digital converters and/or clocks and reset generation units, voltage regulators, memory (such as for instance flash, EEPROM, RAM), error correction code logic and/or timers or other suitable components.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections between various elements as shown and described with respect to the drawings may be a type of connection suitable to transfer signals from or to the respective nodes, units or devices, for example via intermediate devices. Accordingly, unless implied or stated otherwise the connections may for example be direct connections or indirect connections.

Because the apparatus implementing the present invention is, for the most part, composed of electronic components and circuits known to those skilled in the art, details of the circuitry and its components will not be explained in any greater extent than that considered necessary as illustrated above, for the understanding and appreciation of the underlying concepts of the present invention and in order not to obfuscate or distract from the teachings of the present invention.

Also, the invention is not limited to physical devices or units implemented in non-programmable hardware, but can also be applied in programmable devices or units able to perform the desired device functions by operating in accordance with suitable program code. Furthermore, the devices may be physically distributed over a number of apparatuses, while functionally operating as a single device. Devices functionally forming separate devices may be integrated in a single physical device. Those skilled in the art will recognize that the boundaries between logic or functional blocks are merely illustrative and that alternative embodiments may merge logic or functional blocks or impose an alternate decomposition of functionality upon various logic or functional blocks.

In the description, any reference signs shall not be construed as limiting the claim. The word "comprising" does not exclude the presence of other elements or steps then those listed in a claim. Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage. The order of method steps as presented in a claim does not prejudice the order in which the steps may actually be carried, unless specifically recited in the claim.

Skilled artisans will appreciate that the illustrations of chosen elements in the drawings are only used to help to improve the understanding of the functionality and the arrangements of these elements in various embodiments of the present invention. Also, common and well understood elements that are useful or necessary in a commercially feasible embodiment are generally not depicted in the drawings in order to facilitate the understanding of the technical concept of these various embodiments of the present invention. It will further be appreciated that certain procedural stages in the described methods may be described or depicted in a particular order of occurrence while those skilled in the art will understand that such specificity with respect to sequence is not actually required.

What is claimed is:

1. A network analyzer system, comprising:
   a network analyzer having at least two ports;
   a first operational device connected a first port of the at least two ports of the network analzyer and configured to perform a first calibration task with the network analyzer; and
   a second operational device connected a second port of the at least two ports of the network analzyer and configured to perform a second calibration task with the network analyzer, the second calibration task being performed at least partially concurrently with the first calibration task and the second calibration task being performed over a different frequency band or power level than the first calibration task.

2. The network analyzer system of claim 1, wherein the network analyzer comprises a vector network analyzer.

3. The network analyzer system of claim 1, further comprising:
   a first cable connecting the first port of the at least two ports of the network analyzer to the first operational device.

4. The network analyzer system of claim 3, further comprising:
   a second cable connecting the second port of the at least two ports of the network analyzer to the second operational device.

5. The network analyzer system of claim 1, wherein the first operational device comprises a calibration device.

6. The network analyzer system of claim 5, wherein the second operational device comprises a calibration device.

7. The network analyzer system of claim 1, wherein the second operational device comprises a calibration device.

8. The network analyzer system of claim 1, wherein the first operational device is configured to operate in a frequency band different from the frequency band the second operational device is configured to operate in.

9. The network analyzer system of claim 1, wherein the first operational device is configured to operate on a power level different from the power level the second operational device is configured to operate on.

10. The network analyzer system of claim 1, wherein the first operational device is configured to operate with an operation technique different from the operation technique the second operational device is configured to operate with.

11. The network analyzer system of claim 1, wherein the first operational device comprises a first detector and the second operational device comprises a second detector, the second detector being of a detector type that is different from the detector type of the first detector.

12. The network analyzer system of claim 1, wherein the first operational device comprises a first detector and the second operational device comprises a second detector, the second detector being of a detector type that is different from the detector type of the first detector.

13. The network analyzer system of claim 1, wherein the second calibration task involves a complementary operation to the operation of the first calibration task.

14. The network analyzer system of claim 1, wherein the second calibration task is a verification operation for the result of the first calibration task.

15. The network analyzer system of claim 1, wherein the second calibration task utilizes a noise source to perform a noise figure or noise path calibration of the network analyzer.

16. The network analyzer system of claim 1, wherein the second calibration task is configured to measure a set of independent standards.

17. The network analyzer system of claim 1, wherein the network analyzer comprises at least four ports.

18. The network analyzer system of claim 17, wherein the network analyzer comprises at least eight ports.

19. A network analyzer system, comprising:
   a network analyzer having at least two ports; and
   an operational device having a first operational unit connected a first port of the at least two ports of the network analyzer and configured to perform a first calibration task with the network analyzer and a second operational unit connected a second port of the at least two ports of the network analyzer and configured to perform a second calibration task with the network analyzer, the second calibration task being performed at least partially concurrently with the first calibration task and the second calibration task being performed over a different frequency band or power level than the first calibration task.

20. The network analyzer system of claim 19, wherein the network analyzer comprises a vector network analyzer.

21. The network analyzer system of claim 19, further comprising:
a first cable connecting the first port of the at least two ports of the network analyzer to the first operational unit.

22. The network analyzer system of claim 21, further comprising:
a second cable connecting the second port of the at least two ports of the network analyzer to the second operational unit.

23. The network analyzer system of claim 19, wherein the first operational unit comprises a calibration device.

24. The network analyzer system of claim 23, wherein the second operational unit comprises a calibration device.

25. The network analyzer system of claim 19, wherein the second operational unit comprises a calibration device.

26. The network analyzer system of claim 19, wherein the first operational unit is configured to operate in a frequency band different from the frequency band the second operational unit is configured to operate in.

27. The network analyzer system of claim 19, wherein the first operational unit is configured to operate on a power level different from the power level the second operational unit is configured to operate on.

28. The network analyzer system of claim 19, wherein the first operational unit is configured to operate with an operation technique different from the operation technique the second operational unit is configured to operate with.

29. The network analyzer system of claim 19, wherein the first operational unit comprises a first detector and the second operational unit comprises a second detector, the second detector being of a detector type that is different from the detector type of the first detector.

30. The network analyzer system of claim 19, wherein the first operational unit comprises a first detector and the second operation alunit comprises a second detector, the second detector being of a detector type that is different from the detector type of the first detector.

31. The network analyzer system of claim 19, wherein the second calibration task involves a complementary operation to the operation of the first calibration task.

32. The network analyzer system of claim 19, wherein the second calibration task is a verification opperation for the result of the first calibration task.

33. The network analyzer system of claim 19, wherein the second calibration task utilizes a noise source to perform a noise figure or noise path calibration of the network analyzer.

34. The network analyzer system of claim 19, wherein the second calibration task is configured to measure a set of independent standards.

35. The network analyzer system of claim 19, wherein network analyzer comprises at least four ports.

36. The network analyzer system of claim 35, wherein network analyzer comprises at least eight ports.

37. A method for operating a network analyzer, the method comprising:
performing a first calibration task with a network analyzer under the control of a first operational device connected to a first port of a network analyzer; and
performing a second calibration task with the network analyzer under the control of a second operational device connected to a second port of the network analyzer, the second calibration task being performed at least partially concurrently to the first calibration task, and the second calibration task being performed over a different frequency band or power level than the first calibration task.

38. A method for operating a network analyzer, the method comprising:
performing a first calibration task with a network analyzer under the control of a first unit of an operational device connected to a first port of a network analyzer; and
performing a second calibration task with the network analyzer under the control of a second unit of the operational device connected to a second port of the network analyzer, the second calibration task being performed at least partially concurrently to the first calibration task, and the second calibration task being performed over a different frequency band or power level than the first calibration task.

* * * * *